(12) United States Patent
Harper et al.

(10) Patent No.: US 9,209,091 B1
(45) Date of Patent: Dec. 8, 2015

(54) INTEGRATED MONOLITHIC GALVANIC ISOLATOR

(75) Inventors: David Harper, Battle Ground, WA (US); Sudarsan Uppili, Portland, OR (US); Fanling Hsu Yang, Beaverton, OR (US); David L. Snyder, Beaverton, OR (US); Christopher S. Blair, Lake Oswego, OR (US); Guillaume Bouche, Beaverton, OR (US)

(73) Assignee: Maxim Integrated Products, Inc., San Jose, CA (US)

( * ) Notice: Subject to any disclaimer, the term of this patent is extended or adjusted under 35 U.S.C. 154(b) by 793 days.

(21) Appl. No.: 13/198,833

(22) Filed: Aug. 5, 2011

(51) Int. Cl.
*H01L 21/00* (2006.01)
*H01L 21/84* (2006.01)
*H01L 27/12* (2006.01)

(52) U.S. Cl.
CPC ............ *H01L 21/84* (2013.01); *H01L 27/1211* (2013.01)

(58) Field of Classification Search
USPC ............ 257/509, E21.561, E27.112; 438/400
See application file for complete search history.

(56) References Cited

U.S. PATENT DOCUMENTS

| | | | |
|---|---|---|---|
| 5,115,289 A | 5/1992 | Hisamoto et al. | |
| 5,346,834 A | 9/1994 | Hisamoto et al. | |
| 5,391,501 A | 2/1995 | Usami et al. | |
| 5,466,621 A | 11/1995 | Hisamoto et al. | |
| 6,344,809 B1 | 2/2002 | Kanekawa et al. | |
| 6,407,432 B1 | 6/2002 | Nemoto et al. | |
| 6,445,055 B2 | 9/2002 | Iwasakii et al. | |
| 6,570,240 B1 | 5/2003 | Ohyanagi et al. | |
| 6,611,051 B2 | 8/2003 | Akiyama et al. | |
| 6,662,344 B2 | 12/2003 | Tamaki et al. | |
| 6,770,535 B2 | 8/2004 | Yamada et al. | |
| 6,853,063 B2 | 2/2005 | Akiyama et al. | |
| 6,873,065 B2 | 3/2005 | Haigh et al. | |
| 7,089,525 B2 | 8/2006 | Tamaki et al. | |
| 7,091,588 B2 | 8/2006 | Akiyama et al. | |
| 7,244,643 B2 | 7/2007 | Ishitsuka et al. | |
| 7,289,553 B2 | 10/2007 | Yukutake et al. | |
| 7,522,692 B2 | 4/2009 | Yukutake et al. | |
| 7,598,605 B2 | 10/2009 | Akiyama et al. | |
| 2005/0221517 A1* | 10/2005 | Speyer et al. | 438/24 |
| 2007/0262401 A1 | 11/2007 | Yokoyama et al. | |
| 2008/0197362 A1 | 8/2008 | Hisamoto et al. | |
| 2010/0044853 A1* | 2/2010 | Dekker et al. | 257/692 |

OTHER PUBLICATIONS

T. Hashimoto, Y. Yuyama, M. Amishiro, M. Nemoto, S. Yukutake, Y. Kojima, N. Kanekawa, Y. Takeuchi, A. Watanebe; 4-kV 100-Mbps Monolithic Isolator on SOI with Multi-trench Isolation for Wideband Network; Hitachi Research Laboratory, Hitachi Ltd.; IEEE; 2009; pp. 49-52.

(Continued)

*Primary Examiner* — Lynne Gurley
*Assistant Examiner* — Vernon P Webb
(74) *Attorney, Agent, or Firm* — Advent, LLP

(57) ABSTRACT

A semiconductor device is described that includes a first electrical circuit and a second electrical circuit formed on a semiconductor on insulator wafer. The semiconductor on insulator wafer has a layer of semiconducting material formed over a buried layer of insulating material formed over a supporting layer of material. A wide deep trench is formed in the semiconductor on insulator wafer to galvanically isolate the first electrical circuit from the second electrical circuit. The first electrical circuit and the second electrical circuit are coupled together for exchanging energy between the galvanically isolated electrical circuits.

6 Claims, 7 Drawing Sheets

(56) References Cited

OTHER PUBLICATIONS

Thomas Kugelstadt; New digital, capacitive isolators raise the bar in high-performance; Texas Instruments; pp. 1-5.

T. Hashimoto, Y. Yuyama, M. Amishiro, M. Nemoto, S. Yukutake, Y. Kojima, N. Kanekawa, Y. Takeuchi, A. Watanebe; 4-kV 100-Mbps Monolithic Isolator on SOI with Multi-trench Isolation for Wideband Network; IEEE; 2009; pp. 49-52.

* cited by examiner

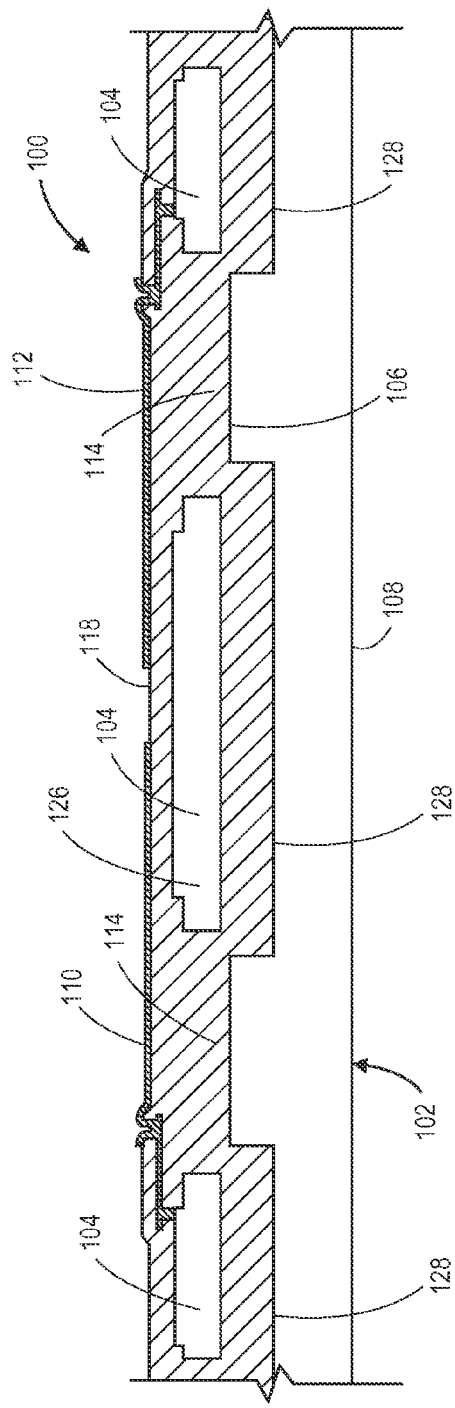
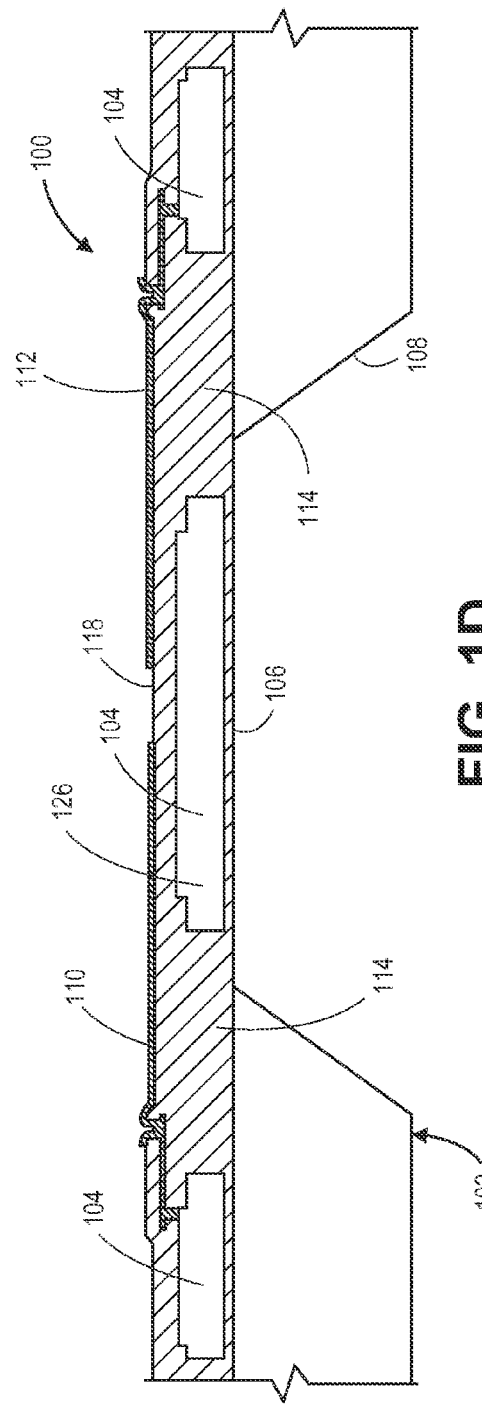
FIG. 1C
FIG. 1D

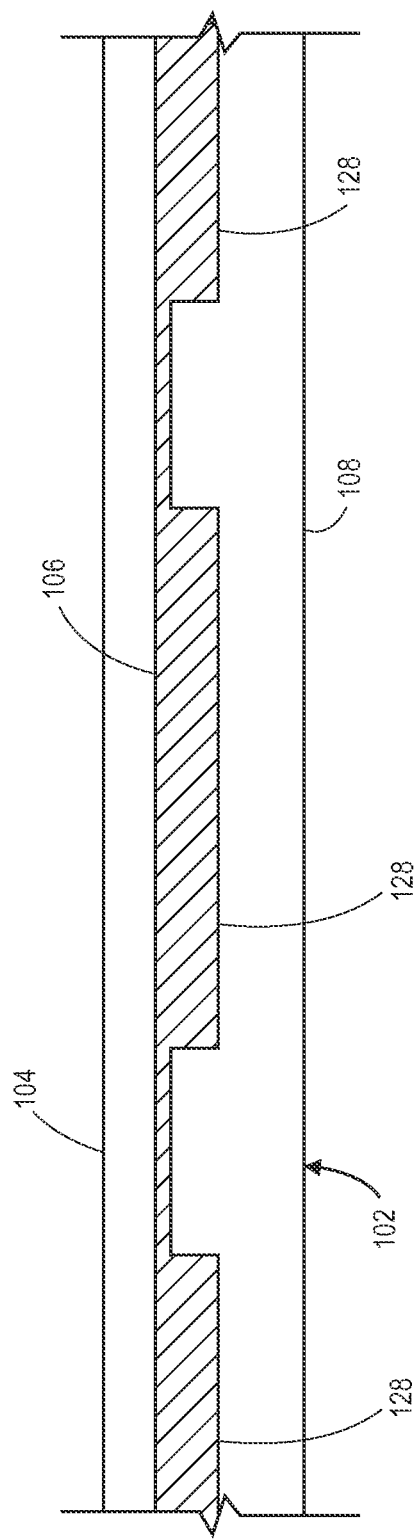

INTEGRATED MONOLITHIC GALVANIC ISOLATOR

BACKGROUND

Galvanic isolation refers to the principle of isolating functional sections of electrical systems to prevent a flow of charge-carrying particles from one section to another. For example, galvanic isolation may be used to prevent electric current from flowing directly from one section of electrical circuitry to another section of electrical circuitry. However, it may still be desirable to exchange energy and/or information between galvanically isolated sections of electrical circuitry. Energy and/or information may be exchanged using, for example, capacitance, induction, electromagnetic waves, optical couplers, acoustics, and mechanical coupling. Thus, a galvanic isolator can function as a "common mode rejecter" that blocks a voltage difference while permitting a signal to pass between sections of electrical circuitry. Galvanic isolation may be employed when two or more electrical circuits must communicate, but are electrically grounded at different potentials. Thus, galvanic isolation can be an effective way to break ground loops by preventing unwanted current from flowing between circuit sections that share a ground conductor. Galvanic isolation is increasingly used in a variety of applications, replacing, for example, optical couplers, which typically require higher power levels and additional controller circuitry; and transformers, which are generally bulkier.

SUMMARY

A semiconductor device is described that includes a first electrical circuit and a second electrical circuit formed on a semiconductor on insulator wafer. The semiconductor on insulator wafer has a layer of semiconducting material formed over a buried layer of insulating material formed over a supporting layer of material. A wide deep trench is formed in the semiconductor on insulator wafer to galvanically isolate the first electrical circuit from the second electrical circuit. The first electrical circuit and the second electrical circuit are coupled together for exchanging energy between the galvanically isolated electrical circuits.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

DRAWINGS

The Detailed Description is described with reference to the accompanying figures. The use of the same reference numbers in different instances in the description and the figures may indicate similar or identical items.

FIG. 1C is a diagrammatic partial cross-sectional side elevation view illustrating a semiconductor device providing monolithic isolation, where a handle wafer substrate is engineered with a number of cavities of insulating material in accordance with an example implementation of the present disclosure.

FIG. 1D is a diagrammatic partial cross-sectional side elevation view illustrating a semiconductor device providing monolithic isolation, where a portion of a handle wafer substrate is removed under an island formed within a layer of semiconducting material in accordance with an example implementation of the present disclosure.

FIG. 9 is a diagrammatic partial cross-sectional side elevation view illustrating a semiconductor on insulator wafer in accordance with another example implementation of the present disclosure.

DETAILED DESCRIPTION

Overview

Figure 1A:
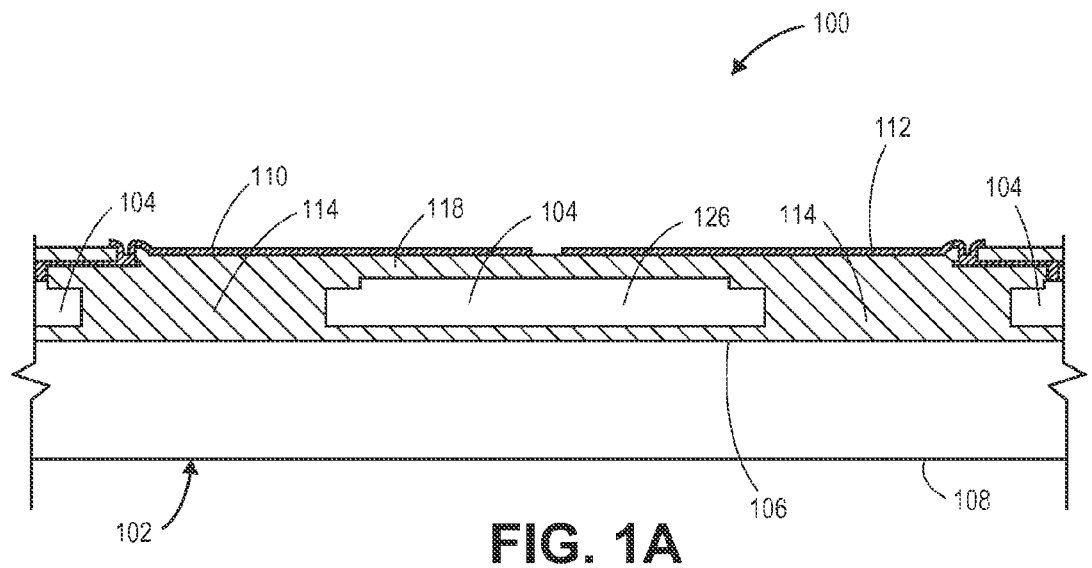
FIG. 1A is a diagrammatic partial cross-sectional side elevation view illustrating a semiconductor device providing monolithic isolation, where an island is formed within a layer of semiconducting material to couple isolated electrical circuit blocks in accordance with an example implementation of the present disclosure.

One way to achieve galvanic isolation between electrical circuits is to employ high value, discrete capacitance between chips on a circuit board. For example, a first chip may be connected to a second chip via a discrete blocking capacitor. However, this type of configuration requires a large circuit size because of the lack of integration. Integrating a blocking capacitor onto a chip may achieve galvanic isolation with a smaller circuit size. One type of configuration uses two or more chips in a multi-chip package, with a large area on a receiving chip occupied by a blocking capacitor, and an extra bonding pad on a transmitting chip. Wire bonding is employed to connect the transmitting and receiving chips. However, this type of configuration increases the cost and complexity of the chip package. Further, large capacitance values are typically required for low frequency signals, while a substantially thick dielectric is typically necessary to sustain high breakdown values.

Silicon-On-Insulator (SOI) technology can be used to provide an SOI wafer with a number of trenches for partitioning the silicon for one electrical circuit block on the wafer from another electrical circuit block on the wafer. In this type of configuration, capacitive coupling may be realized in a third portion of the chip. A large amount of chip area may be required for the capacitor. Additionally, the capacitive transmission may require metal-to-substrate coupling. To prevent lateral coupling across the trench isolation, the capacitively coupled circuit blocks are each enclosed in a concentric series of trenches, which occupy a large area of silicon on the chip.

To evenly distribute the voltage drop across the series of trenches and avoid breakdown due to localization of most of the voltage drop across a single trench, this type of configuration generally requires a complex network of ballast resistors over the trenches. This resistor network adds more design and process complexity, as well as additional cost. The required resistor configuration can be described as a resistor voltage divider network, where high resistance resistors may be required to limit power loss. The resistor voltage divider network consumes power from the circuitry. Further, it should be noted that this type of approach is not truly galvanic, since current flows through the resistor network. It should also be noted that the initial distribution of trench voltages is uneven (e.g., until time constants settle out).

Accordingly, an integrated monolithic galvanic isolator is described that provides isolation between electrical circuit blocks with a single trench for each circuit block. Implementations of the integrated monolithic galvanic isolator have a reduced product area and a reduced process complexity. Because the integrated monolithic galvanic isolator is truly galvanic, it does not require a resistor network, which may otherwise introduce an associated power loss and/or current leakage, as previously discussed. In implementations, the integrated monolithic galvanic isolator can be employed with any application requiring monolithic galvanic isolation, including large, high bandwidth computer networks (e.g., home, business, and industrial computer networks), as well as automotive, medical, and industrial equipment. However, it should be noted that these applications are provided by way of example only, and are not meant to be restrictive of the present disclosure.

The integrated monolithic galvanic isolator can be implemented with a semiconductor device that includes a number of electrical circuits formed on a semiconductor on insulator wafer. The semiconductor on insulator wafer has a layer of semiconducting material formed over a buried layer of insulating material formed over a supporting layer of material. A wide deep trench is formed in the semiconductor on insulator wafer to galvanically isolate the electrical circuits. In some implementations, the wide deep trench is formed by etching multiple trenches in the layer of semiconducting material, where one or more trenches are etched in layers to an intermediate depth between a top surface of the layer of semiconducting material and the buried layer of insulating material, until the buried layer of insulating material is finally exposed by the bottommost trench.

The isolated electrical circuits are coupled together for exchanging energy/information. In implementations, the isolated electrical circuits can be coupled together via capacitive coupling, inductive coupling, photo coupling, giant magnetoresistor coupling, and/or coil coupling. In some implementations, a "floating" electrode island is formed in the layer of semiconducting material to couple the isolated electrical circuits on the semiconductor on insulator wafer. In other implementations, overlapping metal layers can be used as electrodes. In some implementations, the semiconductor on insulator wafer can include an engineered substrate with multiple cavities of insulating material within the supporting layer of material. The cavities of insulating material can be created below electrical circuits to further isolate them from one another. In other implementations, electrical circuits can be further isolated by etching the back side of the semiconductor on insulator wafer to remove portions of the supporting layer of material. Additional mechanical support can be provided for the wafer in this type of configuration.

In the following discussion, example implementations of integrated circuits including one or more integrated monolithic galvanic isolators are first described. Example procedures are then discussed that may be employed to fabricate the example integrated circuits.

Example Implementations

Figure 5:
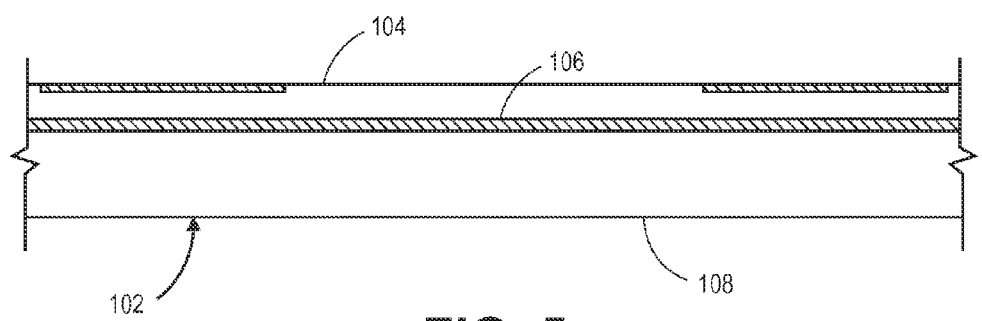
FIG. 5 is a diagrammatic partial cross-sectional side elevation view illustrating a semiconductor on insulator wafer in accordance with an example implementation of the present disclosure.

FIGS. 1A through 3 illustrate semiconductor devices 100 providing monolithic High Voltage (HV) isolation using standard single-chip packaging in accordance with example implementations of the present disclosure. As shown, a semiconductor device 100 may be formed using a semiconductor on insulator wafer, such as a Silicon-On-Insulator (SOI) wafer or a Silicon-On-Sapphire (SOS) wafer. The semiconductor on insulator wafer is comprised of a layer of semiconducting material formed over a buried layer of insulating material formed over a supporting layer of material (handle wafer). For example, a semiconductor device 100 may be formed using an SOI wafer 102 having a doped layer of silicon 104 formed over a buried layer of insulating material 106, such as silicon dioxide or sapphire, formed over a supporting layer of material 108, such as silicon, quartz, sapphire, or glass (e.g., as illustrated in FIG. 5). The thickness of the doped layer of silicon 104 may be between approximately one half micrometer (0.5 µm) and five micrometers (5 µm). For example, in one implementation, the doped layer of silicon 104 is one micrometer (1 µm) thick. The thickness of the buried layer of insulating material 106 may be between approximately two micrometers (2 µm) and twenty micrometers (20 µm). For example, in one implementation, the buried layer of insulating material 106 is four micrometers (4 µm) thick.

In some implementations, the doped layer of silicon 104 includes epitaxial silicon grown directly on the buried layer of insulating material 106. In other implementations, the doped layer of silicon 104 includes epitaxial silicon grown on a thin layer of semiconducting material preformed on the buried layer of insulating material 106. In further implementations, oxygen ion beam implantation is used with high temperature annealing to create the buried layer of insulating material 106 in the SOI wafer 102. In still further implementations, wafer bonding is used to bond oxidized silicon formed on one side of the doped layer of silicon 104 directly to the supporting layer of material 108 to create the buried layer of insulating material 106. However, it should be noted that the preceding implementations are provided by way of example only, and are not meant to be restrictive of the present disclosure. Thus, various other techniques may be used to form the semiconductor on insulator wafer in accordance with the present disclosure.

The doped layer of silicon 104 may be processed using a Complementary Metal-Oxide-Semiconductor (CMOS) fabrication technique, such as Shallow Trench Isolation (STI) and/or Local Oxidation of Silicon (LOCOS) to form semiconductor device components on the SOI wafer 102. For example, components for an electrical circuit block 110 and an electrical circuit block 112 can be formed on the SOI wafer 102 using metal connected to circuits that reside in the doped layer of silicon 104 and form electronic components, such as transistors, that exploit the electronic properties of the doped layer of silicon 104. The various portions of the doped layer of silicon 104 forming the electronic components can be connected together using one or more layers of conductive material, such as, but not limited to, metal layers of aluminum and/or copper. The metal layers may be connected together using vertical electrical connections (vias) formed through insulating material from one metal layer to another metal layer. In some implementations, an STI-first technique can be used to form the electrical circuit blocks 110 and 112, while in other implementations an STI-last technique is used. Further, while two electrical circuit blocks 110 and 112 are illustrated in the accompanying figures, it should be noted that more than two electrical circuit blocks can be formed on the SOI wafer 102 in accordance with the present disclosure.

The semiconductor device 100 is configured to prevent cross-talk between the electrical circuit blocks through the handle wafer/supporting layer of material 108 by isolating the electrical circuit blocks from the underlying substrate. For instance, capacitive isolation between circuit blocks of less than one picofarad (1 pF) may be desirable for some applications. In an SOI-type implementation, electrical circuit blocks 110 and 112 may occupy an area on the SOI wafer 102 of between approximately two tenths millimeters-squared (0.2 mm$^2$) and ten millimeters-squared (10 mm$^2$). Because the series capacitance between the electrical circuit blocks through the supporting layer of material 108 is determined by the area of the circuit blocks and the thickness of the buried layer of insulating material 106, an insulating material thickness of between approximately three and one-half micrometers (3.5 μm) and one hundred seventy-two micrometers (172 μm) may be used for this type of implementation (e.g., in a case where the buried layer of insulating material 106 is formed of silicon dioxide). Thus, the handle wafer/supporting layer of material 108 may be constructed from materials other than silicon, such as quartz, sapphire, and/or glass, in order to endure the heat cycles needed for circuit fabrication without undue warping and/or stress on the wafer.

Two or more circuits formed on the SOI wafer 102 are galvanically/laterally isolated from one another by one or more wide deep trenches. For example, the electrical circuit block 110 and the electrical circuit block 112 are galvanically isolated by a wide deep trench 114 formed in the SOI wafer 102. The wide deep trench 114 is sufficiently wide and deep as described herein to isolate circuits formed on the SOI wafer 102 without requiring multiple trenches between the circuits. For example, the width of the wide deep trench 114 may be selected based upon characteristics such as the thickness and dielectric material composition of the buried layer of insulating material 106, the size of the electrical circuit blocks 110 and 112, and the desired amount of isolation between the electrical circuit blocks 110 and 112. The width of the wide deep trench 114 may be between approximately two micrometers (2 μm) and twenty micrometers (20 μm). For example, in one implementation, the wide deep trench 114 is ten micrometers (10 μm) wide. In this configuration, up to approximately four (4) kilovolts (kV) of isolation can be provided between the electrical circuit blocks 110 and 112.

The electrical circuit blocks 110 and 112 (and possibly other electrical circuit blocks) may be coupled together for exchanging energy and information. In some configurations, one electrical circuit block includes input circuitry for receiving energy from output circuitry included with another circuit block. In other configurations, a duplex implementation can be provided, where the electrical circuit blocks 110 and 112 include both input circuitry and output circuitry. Further, in some configurations, a multi-channel implementation is provided, where more than two electrical circuit blocks are coupled together while being isolated with one monolithic isolator. This type of configuration may be used in, but not limited to, an implementation where several isolators are provided in a single package that can provide functionality for a multiple port network hub, while blocking voltage differences between ports. It should be noted that this type of implementation may provide a cost reduction by including all of the associated circuitry on one chip, rather than providing a number of packages with separate isolators, or a number of separate chips (e.g., one for each port) in a single package.

Figure 2:
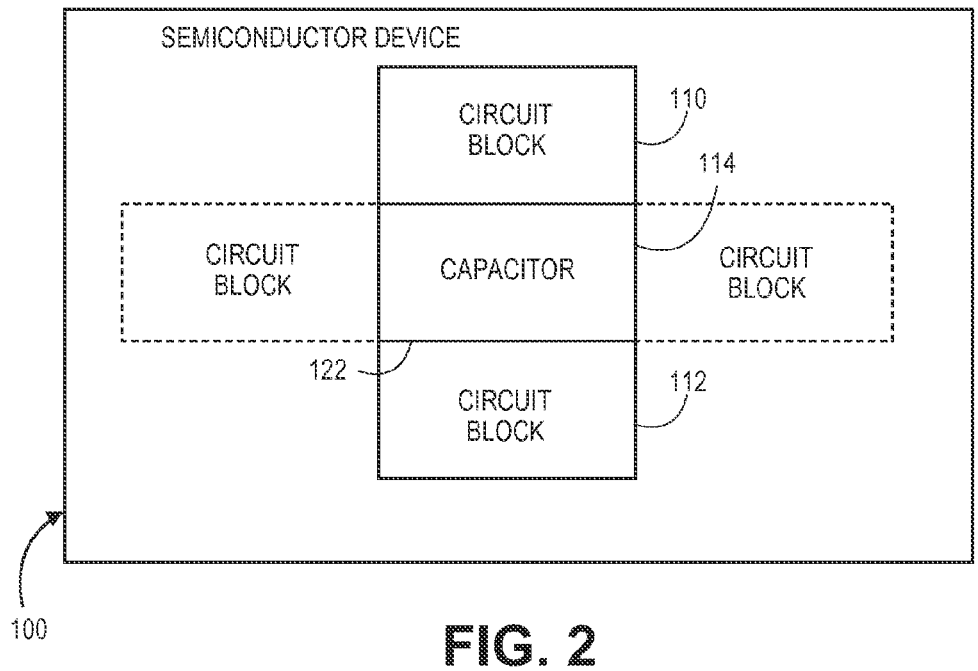
FIG. 2 is a block diagram illustrating a semiconductor device providing monolithic isolation in accordance with an example implementation of the present disclosure.
Figure 3:
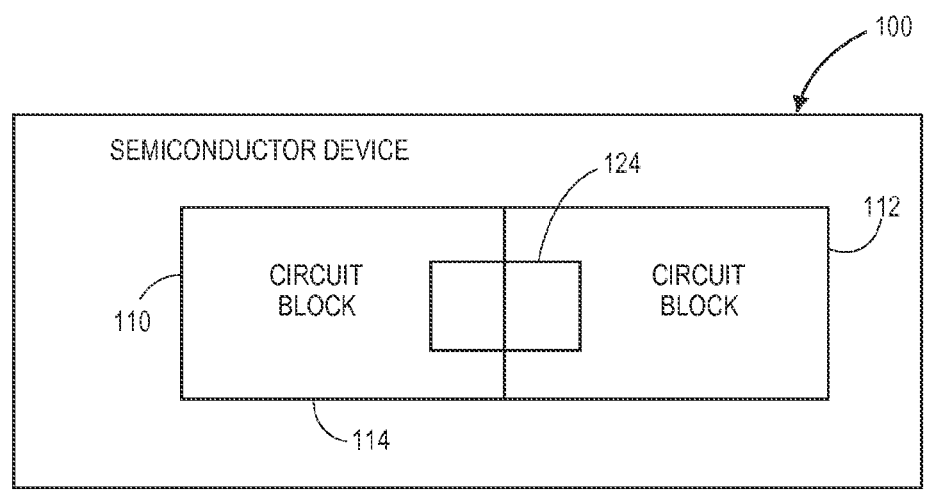
FIG. 3 is a block diagram illustrating a semiconductor device providing monolithic isolation in accordance with another example implementation of the present disclosure.

The electrical circuit block 110 may be coupled to the electrical circuit block 112 via capacitive coupling. For example, the electrical circuit block 110 can include an electrode capacitively coupled to another electrode included with the electrical circuit block 112. The insulating layer of material 118 can be used as the dielectric between the two electrodes. In one implementation, the semiconductor device 100 includes a DC blocking capacitor 122 interposed between the electrical circuit block 110 and the electrical circuit block 112 to couple the electrical circuit blocks 110 and 112 (e.g., as illustrated in FIG. 2). In another implementation, a top layer metal 124 (e.g., a metal four (M4) layer) is overlaid onto the SOI wafer 102 to capacitively couple the electrical circuit blocks 110 and 112 using bottom plates of a DC blocking capacitor included with the electrical circuit blocks 110 and 112 (e.g., as illustrated in FIG. 3). In other implementations, inductive coupling, photo coupling (e.g., photodiode to phototransistor), giant magnetoresistor coupling (e.g., inducing a magnetic field into a magnetically sensitive resistor), and/or coil coupling (e.g., using a transformer) can be used to couple electrical circuit blocks together. However, these coupling techniques are provided by way of example only, and are not meant to be restrictive of the present disclosure. Thus, other techniques may be used with the semiconductor device 100 to couple various electrical circuit blocks together for exchanging energy and information.

Figure 1B:
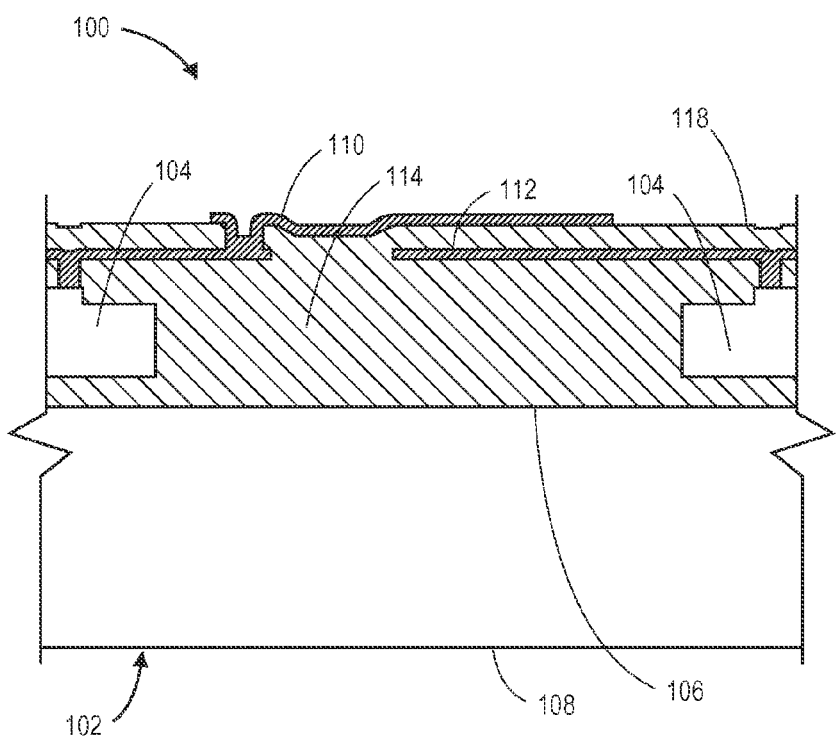
FIG. 1B is a diagrammatic partial cross-sectional side elevation view illustrating a semiconductor device providing monolithic isolation, where overlapping metal layers are used to couple isolated electrical circuit blocks in accordance with an example implementation of the present disclosure.

An island may be formed by separating a portion of the layer of semiconducting material from surrounding semiconducting material, such as an island of silicon 126 surrounded by insulating material 118. By creating the island of silicon 126 within the top silicon film, the silicon island can form a bottom electrode for capacitors in series. For example, a capacitor using a metal plate as a top electrode can be included with each one of the electrical circuit blocks 110 and 112, and the island of silicon 126 "floating" in the insulating material 118 can form the bottom electrode for the two capacitors. In other implementations, instead of realizing capacitive transmission with two capacitances in series using a metal layer for a top electrode and silicon for a bottom electrode, as previously described, two metal layers can be used for both electrodes. It should be noted that this type of configuration may provide less resistance in the bottom electrode (which is metallic instead of doped silicon), less coupling to the handle wafer substrate, and/or good control of the deposited oxide thickness. For example, as illustrated in FIG. 1B, a blocking capacitor may be formed using metal one (M1) and metal two (M2) layers.

However, other implementations are not limited to this type of configuration. For example, other configurations can use any combination of metal layers, such as M1 and metal three (M3) layers. Furthermore, a blocking capacitor may also be constructed from a series combination of two or more capacitors formed between several metal layers. For example, M1 from electrical circuit block 110 could form the bottom plate of an M1 to M3 capacitor, and M1 from electrical circuit block 112 could form the bottom plate of another M1 to M3 capacitor. The top M3 layer of both capacitors is then connected with M3. Such a series combination may double the breakdown voltage of the blocking capacitor. Further, the wide deep trench 114 beneath these series capacitors may increase the breakdown voltage to the underlying silicon.

The SOI wafer 102 may include an engineered substrate. For example, as illustrated in FIG. 9, an SOI wafer 102 can include one or more buried oxide boxes (e.g., cavities of insulating material 128) within the handle wafer substrate/supporting layer of material 108. The cavities of insulating material 128 can be created below the electrical circuit 110 and/or the electrical circuit 112 to further isolate the electrical circuits 110 and 112 from one another, as illustrated in FIG. 1C. In this type of implementation, the SOI wafer 102 can be fabricated with, for example, a Smart Cut process (such as the Soitec Smart Cut process). The electrical circuits 110 and 112 may be further isolated from one another by etching the back side of the SOI wafer 102 to remove portions of the handle wafer substrate/supporting layer of material 108 under blocks sensitive to substrate coupling. For example, as illustrated in FIG. 1D, a portion of the supporting layer of material 108 can be removed below the island of silicon 126. This type of implementation may further prevent lateral substrate coupling. In some instances, etching can be performed on the supporting layer of material 108 using potassium hydroxide (KOH) wet etch and oxide as an etch stop. It should be noted that additional mechanical support may be provided for the SOI wafer 102 in this type of implementation. Supporting material may be formed from an insulator.

Example Fabrication Process

The following discussion describes example techniques for fabricating a semiconductor device that includes an integrated monolithic galvanic isolator. In the implementation described below, the semiconductor device is fabricated utilizing complementary metal-oxide-semiconductor (CMOS) processing techniques. However, it is contemplated that semiconductor devices in accordance with the present disclosure may be fabricated using other semiconductor chip fabrication/packaging technologies, such as wafer-level packaging (WLP), and so on.

Figure 4:
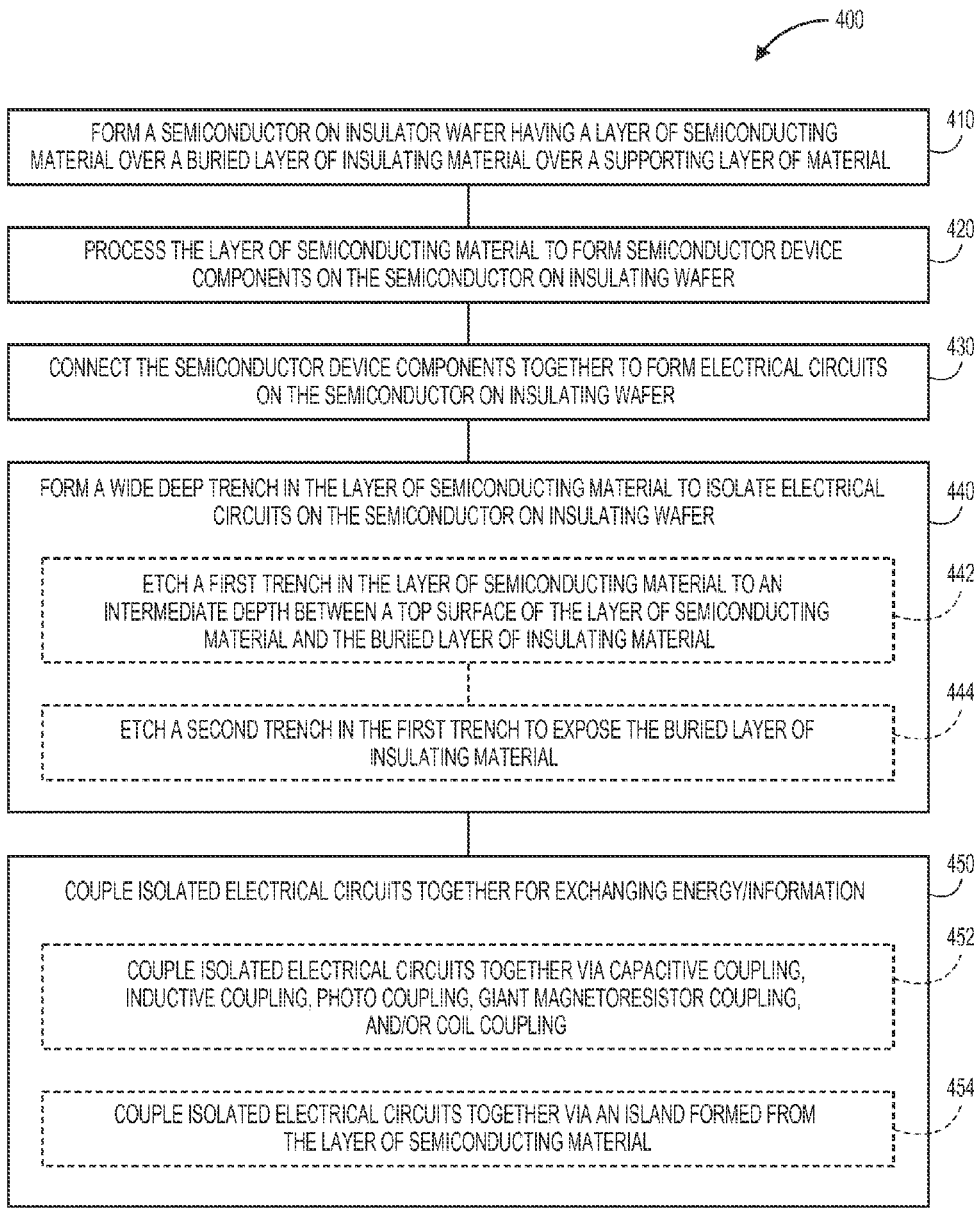
FIG. 4 is a flow diagram illustrating a process for fabricating a semiconductor device providing monolithic isolation in accordance with an example implementation of the present disclosure.

FIG. 4 depicts a process 400, in an example implementation, for fabricating a semiconductor device, such as the example semiconductor devices 100 illustrated in FIGS. 1A through 3 and described above. In the process 400 illustrated, a semiconductor on insulator wafer is formed having a layer of semiconducting material over a buried layer of insulating material over a supporting layer of material (Block 410). For example, with reference to the semiconductor devices 100 described above, the semiconductor devices 100 may be formed using an SOI wafer 102 having a doped layer of silicon 104 formed over a buried layer of insulating material 106, such as silicon dioxide or sapphire, formed over a supporting layer of material 108, such as silicon, quartz, sapphire, or glass (e.g., as illustrated in FIG. 5). The layer of semiconducting material is processed to form semiconductor device components on the semiconductor on insulator wafer (Block 420). For instance, with continuing reference to the semiconductor devices 100 described above, the doped layer of silicon 104 is processed using a Complementary Metal-Oxide-Semiconductor (CMOS) fabrication technique, such as Shallow Trench Isolation (STI) and/or Local Oxidation of Silicon (LOCOS) to form semiconductor device components on the SOI wafer 102. The semiconductor device components are interconnected to form electrical circuit blocks on the semiconductor on insulator wafer (Block 430). For example, with continuing reference to the semiconductor devices 100 described above, the various portions of the doped layer of silicon 104 forming the electronic components can be connected together using one or more layers of conductive material, such as, but not limited to, metal layers of aluminum and/or copper.

Figure 6:
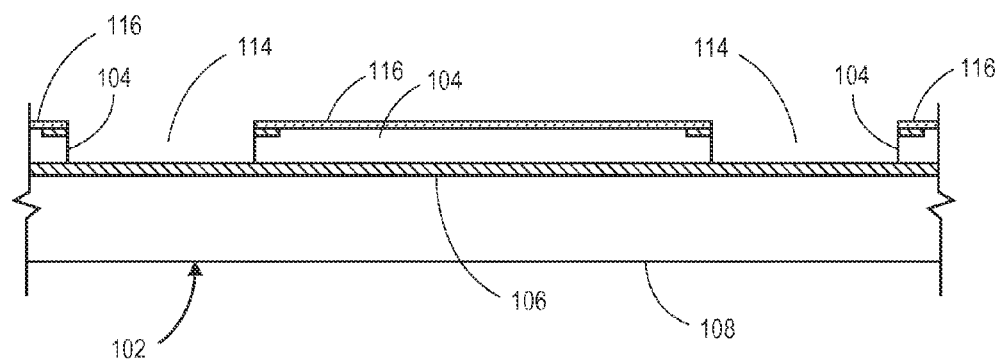
FIG. 6 is a diagrammatic partial cross-sectional side elevation view of the SOI wafer illustrated in FIG. 5, where a photoresistive layer of material has been applied to the top layer of silicon to remove portions of the top layer.

A wide deep trench is formed in the layer of semiconducting material to isolate electrical circuit blocks on the semiconductor on insulator wafer (Block 440). For instance, with continuing reference to the semiconductor devices 100 described above, the electrical circuit block 110 and the electrical circuit block 112 are galvanically isolated by a wide deep trench 114 formed in the SOI wafer 102. The wide deep trench 114 may be formed in the SOI wafer 102 by Ion Etching (IE) the doped layer of silicon 104 to expose the buried layer of insulating material 106. For example, in one implementation, a photoresistive layer of material 116 is applied to the doped layer of silicon 104. A mask may then be used to selectively expose portions of the photoresistive layer of material 116. Next, portions of the photoresistive layer of material 116 are removed to form a pattern defining the shape of the wide deep trench 114. The wide deep trench 114 is formed by ion etching away the portions of the doped layer of silicon 104 not covered by the photoresistive layer of material 116 (e.g., as illustrated in FIG. 6). The photoresistive layer of material 116 may then be removed from the SOI wafer 102.

The etching procedure can be performed multiple times, depending on the depth of the wide deep trench 114. For example, in one implementation, the wide deep trench 114 is formed in a two-step etching procedure, where a first trench is formed by ion etching the doped layer of silicon 104 to an intermediate depth between the top surface of the doped layer of silicon 104 and the buried layer of insulating material 106 (Block 442), and a second trench is etched in the first trench to expose the buried layer of insulating material 106 (Block 444). This type of etching operation may be useful to etch through the top silicon layer while maintaining clean (vertical) edges at the boundaries of the trench. Thus, the energy level of the etching equipment may be tuned to a specific depth shallower than the thickness of the top silicon layer to provide a vertical edge along the trench. When a second trench is formed in the first trench, it too will have a vertical edge (either aligned with the edge of the first trench or forming a step in the silicon from one shallow trench to another). It should be noted that this two-step etching procedure is described by way of example only and is not meant to be restrictive of the present disclosure. Thus, in other implementations, the wide deep trench 114 can be formed by etching the doped layer of silicon 104 more than two times. For example, the second trench can be etched to an intermediate depth between the top surface of the first trench and the buried layer of insulating material 106, and a third trench can be etched in the second trench to expose the buried layer of insulating material 106.

Figure 7:
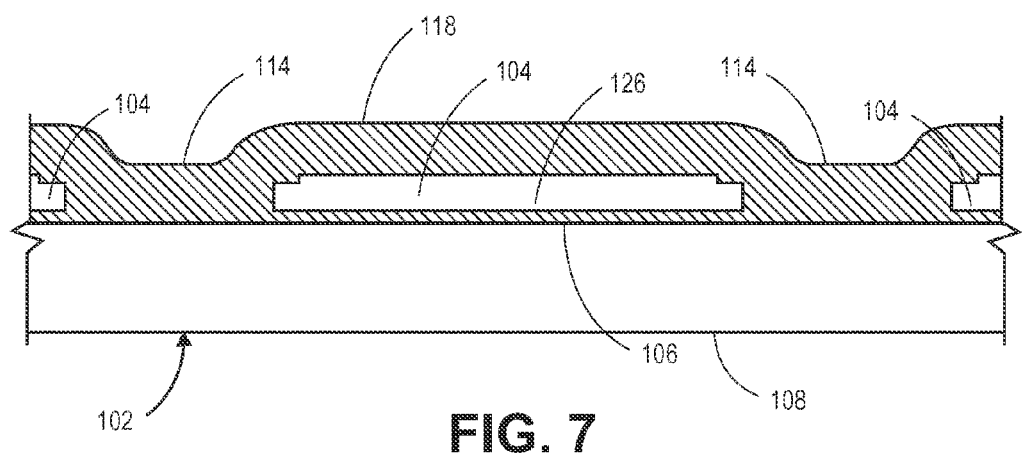
FIG. 7 is a diagrammatic partial cross-sectional side elevation view of the wafer illustrated in FIG. 6, where a layer of silicon dioxide has been applied over the top layer of silicon.
Figure 8:
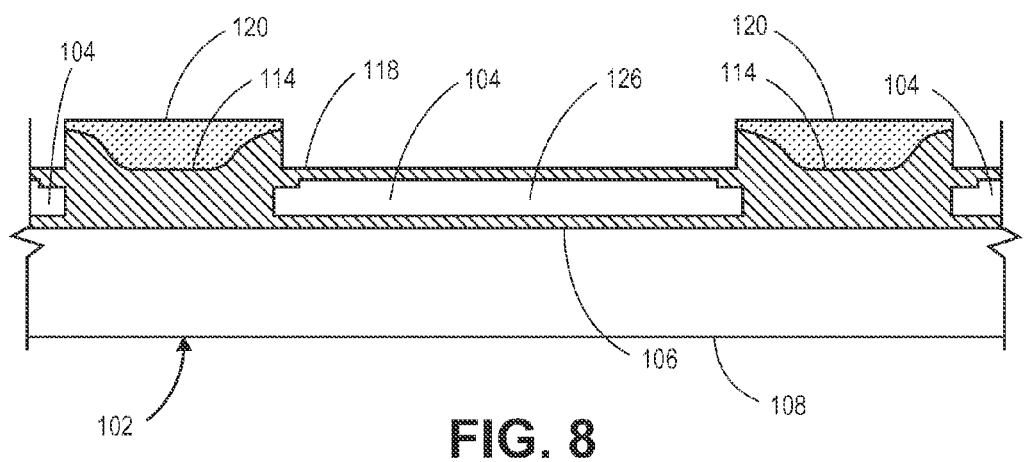
FIG. 8 is a diagrammatic partial cross-sectional side elevation view of the wafer illustrated in FIG. 7, where excess portions of the silicon dioxide have been removed to leave deposits of silicon dioxide in wide deep trenches for insulating electrical circuit blocks from one another.

After one or more portions of the doped layer of silicon 104 have been removed to expose the buried layer of insulating material 106 in the regions forming the wide deep trench 114, the exposed regions may be filled with an insulating layer of material 118 (e.g., silicon dioxide, sapphire, or the like). For example, a layer of silicon dioxide may be deposited over the surface of the SOI wafer 102 to cover the doped layer of silicon 104 and the areas forming the wide deep trench 114 (e.g., as illustrated in FIG. 7). After the insulating layer of material 118 has been deposited, a photoresistive layer of material 120 may be applied to the insulating layer of material 118, and portions of the insulating layer of material 118 can be etched away as previously described. For example, a reverse active IE photo process can be used to remove portions of the insulating material 118. In this manner, excess portions of the insulating material 118 are removed, while the wide deep trench 114 remains filled with the insulating material 118 to provide galvanic isolation between the electrical circuit block 110 and the electrical circuit block 112 (e.g., as illustrated in FIG. 8). After the excess portions of the insulating material 118 have been removed from the SOI wafer 102, Chemical-Mechanical Planarization/Polishing (CMP) can be performed on the surface of the SOI wafer 102 to smooth the surface using chemical and/or mechanical forces. Then, interconnection can be completed for the various components of the electrical circuit blocks on the wafer.

Two or more of the isolated electrical circuit blocks on the semiconductor on insulator wafer are coupled together for exchanging energy/information (Block 450). In some implementations, the isolated electrical circuit blocks are coupled together via capacitive coupling, inductive coupling, photo coupling, giant magnetoresistor coupling, and/or coil coupling (Block 452). For example, with continuing reference to the semiconductor devices 100 described above, the electrical circuit block 110 can include an electrode capacitively coupled to another electrode included with the electrical circuit block 112. In some implementations, an island is formed in the layer of semiconducting material to couple the isolated electrical circuit blocks on the semiconductor on insulator wafer (Block 454). For example, with continuing reference to the semiconductor devices 100 described above, a capacitor using a metal plate as a top electrode can be included with each one of the electrical circuit blocks 110 and 112, and the island of silicon 126 "floating" in the insulating material 118 can form the bottom electrode for the two capacitors.

CONCLUSION

Although the subject matter has been described in language specific to structural features and/or process operations, it is to be understood that the subject matter defined in the appended claims is not necessarily limited to the specific features or acts described above. Rather, the specific features and acts described above are disclosed as example forms of implementing the claims.

What is claimed is:

1. A semiconductor device comprising:
a first electrical circuit formed on a semiconductor on insulator wafer, the semiconductor on insulator wafer having a layer of semiconducting material formed over a buried layer of insulating material formed over a supporting layer of material;
a second electrical circuit formed on the semiconductor on insulator wafer; and
a wide deep trench more than two micrometers (2 μm) wide formed in the semiconductor on insulator wafer to galvanically isolate the first electrical circuit from the second electrical circuit, where the first electrical circuit and the second electrical circuit are coupled together for exchanging energy between the galvanically isolated electrical circuits,
wherein the supporting layer of material comprises a handle wafer substrate, and the semiconductor on insulator wafer is formed with a cavity of insulating material within the handle wafer substrate below at least one of the first electrical circuit or the second electrical circuit for further isolating the first electrical circuit from the second electrical circuit.

2. The semiconductor device as recited in claim 1, wherein the layer of semiconducting material comprises a layer of silicon between at least approximately one half micrometer (0.5 μm) thick and at least approximately five micrometers (5 μm) thick, the buried layer of insulating material comprises a layer of silicon dioxide between at least approximately two micrometers (2 μm) thick and at least approximately twenty micrometers (20 μm) thick, and the wide deep trench is between at least approximately five micrometers (5 μm) wide and at least approximately twenty micrometers (20 μm) wide.

3. The semiconductor device as recited in claim 1, wherein the wide deep trench formed in the semiconductor on insulator wafer comprises a first trench etched in the layer of semiconducting material to an intermediate depth between a top surface of the layer of semiconducting material and the buried layer of insulating material, and a second trench etched in the first trench to expose the buried layer of insulating material.

4. The semiconductor device as recited in claim 1, wherein the first electrical circuit and the second electrical circuit are coupled together via at least one of capacitive coupling, inductive coupling, photo coupling, giant magnetoresistor coupling, or coil coupling.

5. The semiconductor device as recited in claim 1, wherein the first electrical circuit and the second electrical circuit are capacitively coupled together via an island formed from the layer of semiconducting material.

6. The semiconductor device as recited in claim 5, wherein a portion of the supporting layer of material is etched away below the layer of insulating material below the island formed from the layer of semiconducting material for further isolating the first electrical circuit from the second electrical circuit.

* * * * *